United States Patent [19]

Kim

[11] Patent Number: 5,756,235
[45] Date of Patent: May 26, 1998

[54] PHASE SHIFT MASK AND METHOD FOR FABRICATING THE SAME

[75] Inventor: Hung Eil Kim, Kyoungki-do, Rep. of Korea

[73] Assignee: Hyundai Electronics Industries Co., Ltd., Kyoungki-do, Rep. of Korea

[21] Appl. No.: 710,402

[22] Filed: Sep. 17, 1996

[30] Foreign Application Priority Data

Sep. 18, 1995 [KR] Rep. of Korea .................. 95-30481

[51] Int. Cl.$^6$ .................................................. G03F 1/08
[52] U.S. Cl. ............................. 430/5; 430/322; 430/324
[58] Field of Search .......................... 430/5, 324, 321, 430/322

[56] References Cited

U.S. PATENT DOCUMENTS

| | | | |
|---|---|---|---|
| 4,835,078 | 5/1989 | Harvey et al. | 430/5 |
| 5,153,083 | 10/1992 | Garofalo et al. | 430/5 |
| 5,262,257 | 11/1993 | Fukuda et al. | 430/22 |
| 5,604,059 | 2/1997 | Imura et al. | 430/5 |

*Primary Examiner*—George F. Lesmes
*Assistant Examiner*—Bernard P. Codd
*Attorney, Agent, or Firm*—Gary M. Nath; Nath & Associates

[57] ABSTRACT

A phase shift mask provided with an alignment error measuring pattern which is a phase shift film pattern portion formed in a space defined between dense patterns of the phase shift mask having an alternating type pattern structure so that an error in alignment between a chromium pattern and a phase shift film pattern occurring in the fabrication of the phase shift mask can be measured by checking, through a microscope, a wafer provided with a pattern formed using the phase shift mask. The phase shift film pattern portion is arranged on the central portion of a quartz substrate.

14 Claims, 4 Drawing Sheets

PHASE SHIFT MASK AND METHOD FOR FABRICATING THE SAME

BACKGROUND OF THE INVENTION

1. Field of the Invention

The present invention relates to a phase shift mask provided with a pattern adapted to measure an alignment error occurring among patterns in the fabrication of the phase shift mask and the method for fabricating such a phase shift mask.

2. Description of the Prior Art

Phase shift masks have various types. For example, there is a chromiumless type phase shift mask which will have high applicability in the future because it has a simple structure in terms of the pattern design and fabrication as compared to other types of phase shift masks. Although this phase shift mask exhibits a substantial improvement in resolution and depth of focus, it creates a problem when it is practically applied to the fabrication of semiconductor devices.

The principle of such phase shift masks is to form a pattern by utilizing a disappearing interfere phenomenon caused by a phase difference between 0° to 180°. Basically, this pattern formation depends on the wavelength used in steppers. The wavelength mainly used in known steppers is the i-line wavelength ($\lambda$=365 nm).

Since phase shift masks are used in fabricating semiconductor devices having a dimension of 0.3 μm or less, error in alignment between a chromium pattern and a phase shift film pattern in the fabrication of a mask is seriously problematic.

For this reason, an alignment error measuring device is used to measure such an alignment error on a mask immediately after the fabrication of the mask is completed. However, the use of such an alignment error measuring device involves other problems. Accordingly, it is required to provide a method in which an error in alignment between the chromium pattern and phase shift film pattern is measured using a microscope after duplicating a mask pattern on a wafer. In addition, it is also required to check the effect of the process as used upon measuring the pattern alignment error.

SUMMARY OF THE INVENTION

Therefore, an object of the invention is to provide a phase shift mask provided with an alignment error measuring pattern which is a phase shift film pattern portion formed in a space defined between dense patterns of the phase shift mask having an alternating type pattern structure so that an error in alignment between a chromium pattern and a phase shift film pattern occurring in the fabrication of the phase shift mask can be measured by checking, through a microscope, a wafer provided with a pattern formed using the phase shift mask, and to provide a method for fabricating the phase shift mask.

Another object of the invention is to provide a phase shift mask having a structure capable of accurately measuring a pattern alignment error involved in the phase shift mask without using a separate measuring device so that it can be appropriately applied to the formation of micro patterns for highly integrated semiconductor devices, and to provide a method for fabricating the phase shift mask.

In accordance with one aspect of the present invention, a phase shift mask comprises a transparent substrate; a photo shield film pattern formed on the transparent substrate, the photo shield film pattern having a plurality of uniformly spaced pattern portions, but having no pattern portion at the central portion of the transparent substrate; a phase shift film pattern formed on the transparent substrate in such a manner that it has a plurality of uniformly spaced pattern portions arranged in an alternating fashion with respect to the pattern portions of the photo shield film pattern, the phase shift film pattern having a pattern portion arranged on the central portion of the transparent substrate; and a pair of spaces respectively defined at opposite sides of the phase shift film pattern portion arranged on the central portion of the transparent substrate, the spaces having the same width as the interval between adjacent pattern portions of the photo shield film pattern, so that the phase shift mask has a function of measuring an alignment error between the photo shield film pattern and phase shift film pattern.

In accordance with another aspect of the present invention, a method for fabricating a phase shift mask, comprises the steps of: preparing a transparent substrate; forming a photo shield film pattern on the transparent substrate in such a manner that the photo shield film pattern has a plurality of uniformly spaced pattern portions while having no pattern portion at the central portion of the transparent substrate; and forming a phase shift film pattern on the transparent substrate in such a manner that the phase shift film pattern has a plurality of uniformly spaced pattern portions arranged in an alternating fashion with respect to the pattern portions of the photo shield film pattern and that the phase shift film pattern has a central pattern portion arranged on the central portion of the transparent substrate to define a pair of spaces which are defined respectively at opposite sides of the central pattern portion while having the same width as the interval between adjacent pattern portions of the photo shield film pattern, so that the phase shift mask has a function of measuring an alignment error between the photo shield film pattern and phase shift film pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
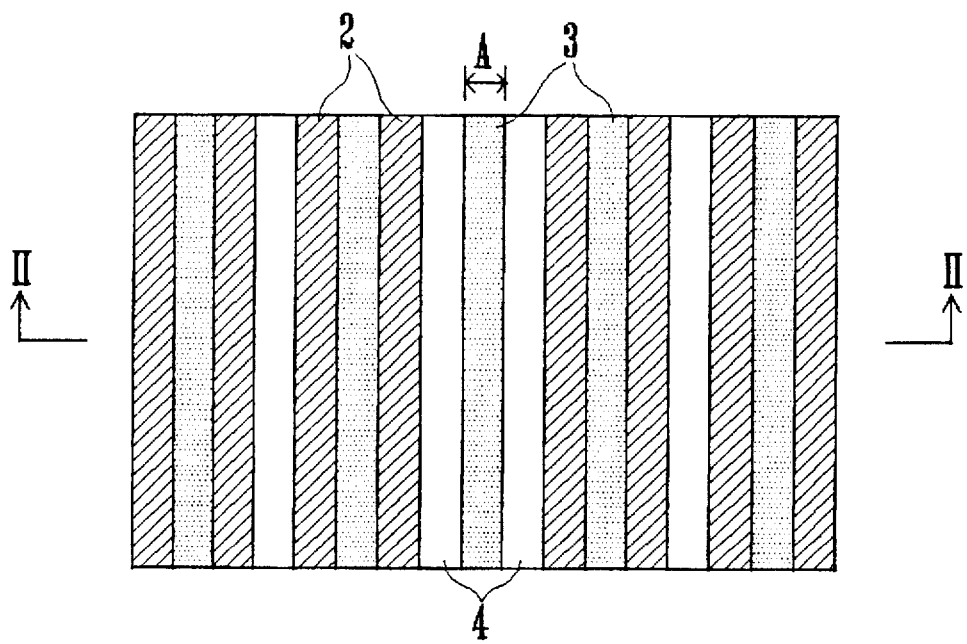
FIG. 1 is a plan view of a phase shift mask in accordance with an embodiment of the present invention, which is provided with a pattern adapted to measure an error in alignment between a chromium pattern and a phase shift film pattern occurring in the fabrication of the phase shift mask.
Figure 2:
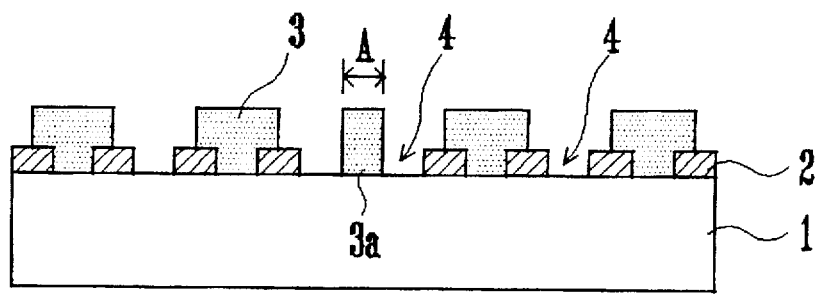
FIG. 2 is a cross-sectional view taken along the line II—II in FIG. 1.

FIG. 1 is a plan view of a phase shift mask in accordance with an embodiment of the present invention, which is provided with a pattern adapted to measure an error in alignment between a chromium pattern and a phase shift film pattern occurring in the fabrication of the phase shift mask. FIG. 2 is a cross-sectional view taken along the line II—II in FIG. 1.

As shown in FIGS. 1 and 2, the phase shift mask includes a quartz substrate, which is denoted by the reference numeral 1 in FIG. 2. A chromium pattern 2 is formed on the quartz substrate 1 to have a plurality of uniformly spaced pattern portions. The chromium pattern 2 has no pattern portion at the central portion of the quartz substrate 1. The central portion of the quartz substrate 1 is denoted by the reference character A in FIG. 2. The phase shift mask also includes a phase shift film pattern 3 formed on the quartz substrate 1. The phase shift film pattern 3 has a plurality of uniformly spaced pattern portions each arranged between desired adjacent ones of the chromium pattern portions. In particular, the phase shift film pattern 3 has a central pattern portion 3a formed on the central portion A of the quartz substrate 1. Thus, the phase shift mask has an alternating type pattern structure.

The central pattern portion 3a of the phase shift film pattern 3 is arranged in such a manner that it is spaced from pattern portions of the chromium pattern 2 adjacent thereto by a desired distance to define a pair of spaces 4 having a phase angle of 0° at opposite sides thereof.

The chromium pattern 2 has a line width of about 0.35 μm and a space width of 0.35 μm. The space width of the chromium pattern 2 may be appropriately determined.

The pattern portion 3a of the phase shift film pattern 3 formed on the central portion A of the quartz substrate 1 is spaced from each adjacent chromium pattern portion by about 0.35 μm. The interval between the phase shift film pattern portion 3a and each adjacent chromium pattern portion may be appropriately determined.

Figure 3:
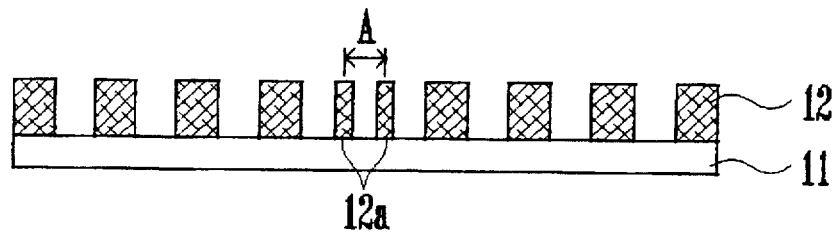
FIG. 3 is a sectional view illustrating a photoresist film pattern formed by conducting a light exposure and development process for a photoresist film formed over a wafer while using the phase shift mask shown in FIG. 1.

FIG. 3 is a sectional view illustrating a photoresist film pattern formed by conducting a light exposure and development process for a photoresist film formed over a wafer while using the phase shift mask shown in FIG. 1.

As shown in FIG. 3, the photoresist film pattern has a pair of pattern portions 12a which are formed on the central portion of the wafer denoted by the reference character A to have a small width by virtue of opposite side boundary surfaces of the phase shift film pattern portion 3a.

Figure 4:
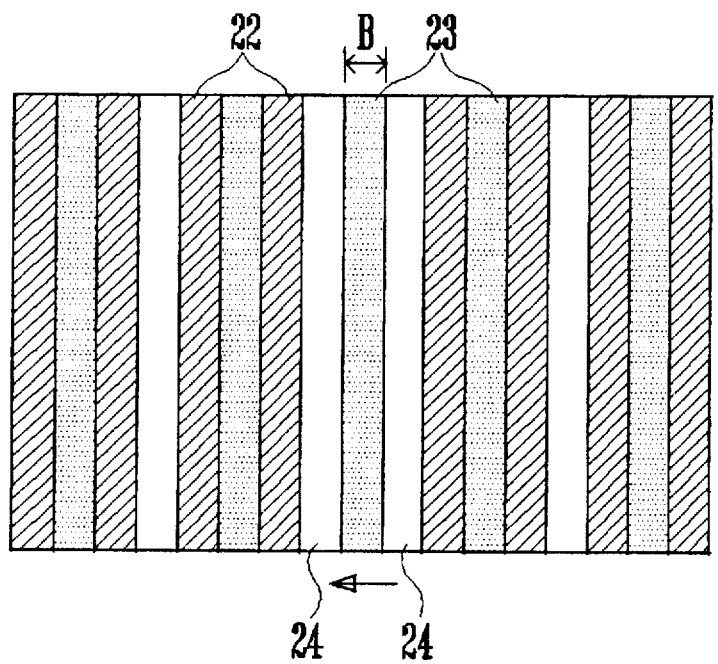
FIG. 4 is a plan view of a phase shift mask fabricated in accordance with the present invention, in which its alignment error measuring pattern is arranged in such a manner that it is shifted left.

FIG. 4 is a plan view of a phase shift mask fabricated in accordance with the present invention to have a pattern adapted to measure an error in alignment between a chromium pattern and a phase shift film pattern occurring in the fabrication of the phase shift mask.

As shown in FIG. 4, the phase shift mask includes a chromium pattern 22 and a phase shift film pattern 23 formed on a quartz substrate (not shown) in such a manner that they have alternating pattern portions as mentioned above in conjunction with FIGS. 1 and 2.

In this case, the phase shift film pattern 23 has a central pattern portion arranged in such a manner that it is shifted left, namely, in the direction indicated by the arrow in FIG. 4.

Figure 5:
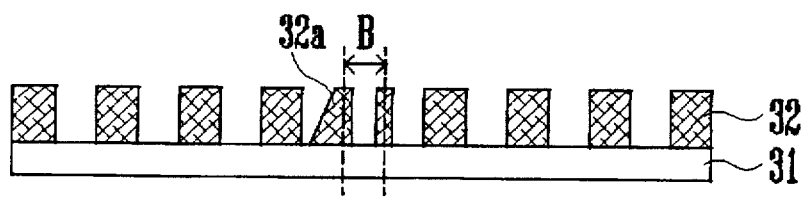
FIG. 5 is a sectional view illustrating an alignment error measuring pattern formed upon forming a photoresist film pattern on a wafer using the phase shift mask shown in FIG. 4.

FIG. 5 is a sectional view illustrating an alignment error measuring pattern formed upon forming a photoresist film pattern on a wafer using the phase shift mask shown in FIG. 4.

Referring to FIG. 5, it can be found that the photoresist film pattern has a pattern portion 32a formed at the left side boundary of the central pattern portion of the phase shift film pattern 23 in the phase shift mask in such a manner that it is inaccurately arranged on the central portion B of the wafer due to the left shifting of the central pattern portion of the phase shift film pattern 23.

Figure 6:
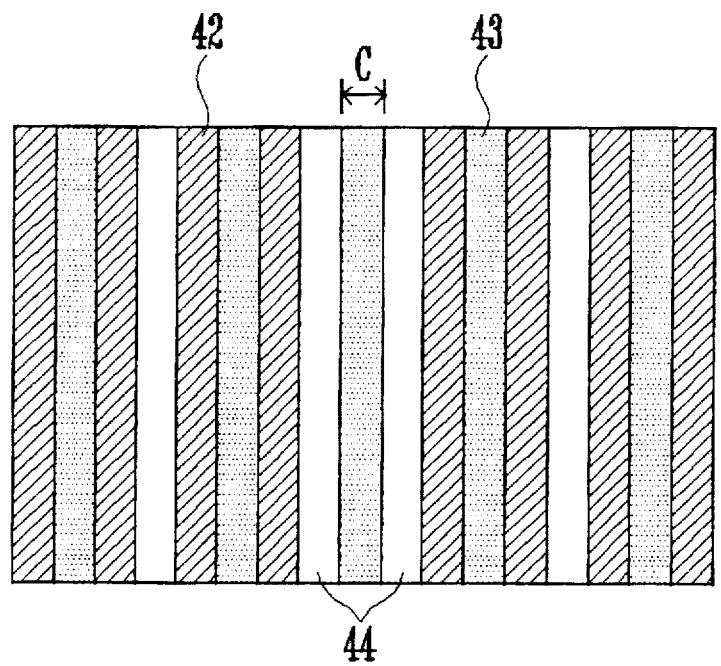
FIG. 6 is a plan view of another phase shift mask fabricated in accordance with the present invention, in which its alignment error measuring pattern is accurately arranged without being shifted.

FIG. 6 is a plan view of another phase shift mask fabricated in accordance with the present invention to have a pattern adapted to measure an error in alignment between a chromium pattern and a phase shift film pattern occurring in the fabrication of the phase shift mask.

As shown in FIG. 6, the phase shift mask includes a chromium pattern 42 and a phase shift film pattern 43 formed on a quartz substrate (not shown) in such a manner that they have alternating pattern portions as mentioned above in conjunction with FIGS. 1 and 2.

In this case, the phase shift film pattern 43 has a central pattern portion accurately arranged on the central portion C of the quartz substrate without being shifted.

Figure 7:
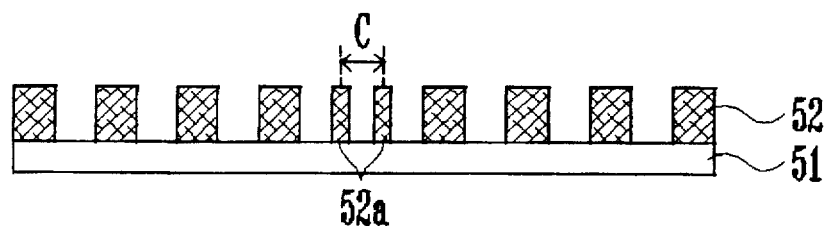
FIG. 7 is a sectional view illustrating an alignment error measuring pattern formed upon forming a photoresist film pattern on a wafer using the phase shift mask shown in FIG. 6.

FIG. 7 is a sectional view illustrating an alignment error measuring pattern formed upon forming a photoresist film pattern on a wafer using the phase shift mask shown in FIG. 6.

Referring to FIG. 7, the photoresist film pattern has narrow pattern portion 52a respectively formed at opposite side boundaries of the central pattern portion of the phase shift film pattern 43 in the phase shift mask in such a manner that they are accurately arranged on the central portion C of the wafer.

Figure 8:
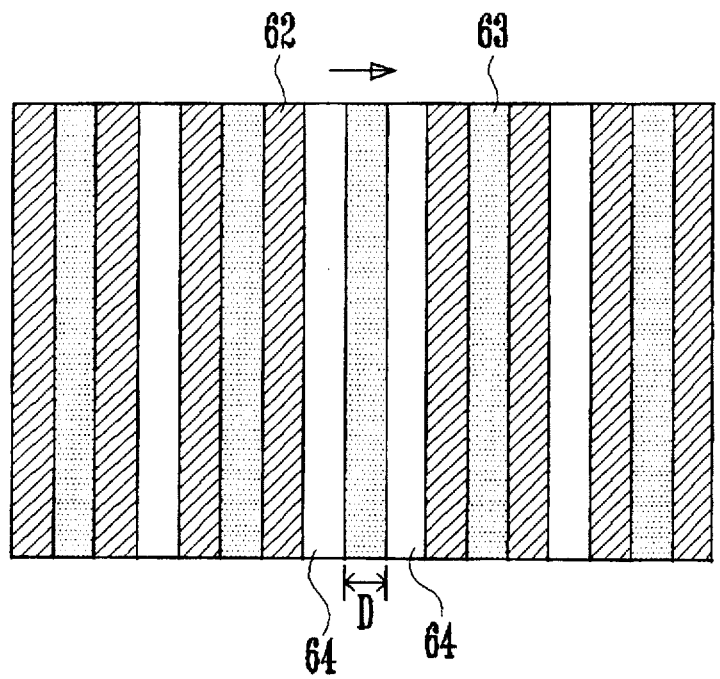
FIG. 8 is a plan view of another phase shift mask fabricated in accordance with the present invention, in which its alignment error measuring pattern is arranged in such a manner that it is shifted right.

FIG. 8 is a plan view of another phase shift mask fabricated in accordance with the present invention to have a pattern adapted to measure an error in alignment between a chromium pattern and a phase shift film pattern occurring in the fabrication of the phase shift mask.

As shown in FIG. 8, the phase shift mask includes a chromium pattern 62 and a phase shift film pattern 63 formed on a quartz substrate (not shown) in such a manner that they have alternating pattern portions as mentioned above in conjunction with FIGS. 1 and 2.

In this case, the phase shift film pattern 63 has a central pattern portion arranged in such a manner that it is shifted right, namely, in the direction indicated by the arrow in FIG. 8.

Figure 9:
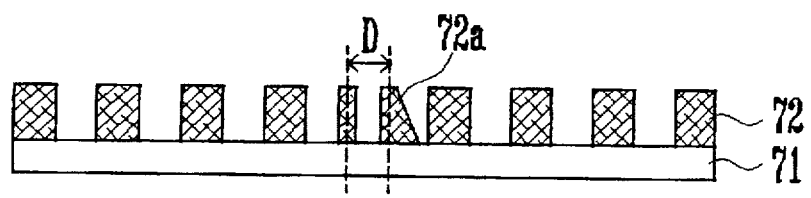
FIG. 9 is a sectional view illustrating an alignment error measuring pattern formed upon forming a photoresist film pattern on a wafer using the phase shift mask shown in FIG. 8.

FIG. 9 is a sectional view illustrating an alignment error measuring pattern formed upon forming a photoresist film pattern on a wafer using the phase shift mask shown in FIG. 8.

Referring to FIG. 9, the photoresist film pattern has a pattern portion 72a formed at the right side boundary of the central pattern portion of the phase shift film pattern 63 in the phase shift mask in such a manner that it is inaccurately arranged on the central portion D of the wafer due to the right shifting of the central pattern portion of the phase shift film pattern 63.

Thus, the phase shift mask fabricated in accordance with the present invention has the effect of measuring an alignment error between the chromium pattern and phase shift film pattern occurring in the fabrication of the phase shift mask.

The phase shift mask of the present invention has various effects. For example, the present invention can be applied to the fabrication of a phase shift mask involving etching a quartz substrate to a certain depth and using an SOG, PMMA or oxide film as a phase shift film. The phase shift mask of the present invention can also measure a pattern alignment error by utilizing a phase different of about 180°.

The phase shift mask according to the present invention can also be applied to any steppers having various wavelengths. Examples include the G-line (X=436 nm), I-line (X=365 nm) and DUV (248 to 150 nm) wavelengths.

In accordance with the present invention, a pattern alignment error may be checked indirectly, without using any measuring device because the measurement the phase shift mask is provided with an alignment error measuring pattern formed in a desired portion of the mask so that an error in alignment between a chromium pattern and a phase shift film pattern occurring in the fabrication of the phase shift mask can be measured by checking, through a microscope, a wafer to which the alignment error measuring pattern is duplicated.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask comprising:

a transparent substrate;

a photo shield film pattern formed on the transparent substrate, the photo shield film pattern having a plurality of uniformly spaced pattern portions, but having no pattern portion at the central portion of the transparent substrate;

a phase shift film pattern formed on the transparent substrate in such a manner that it has a plurality of uniformly spaced pattern portions arranged in an alternating fashion with respect to the pattern portions of the photo shield film pattern, the phase shift film pattern having a pattern portion arranged on the central portion of the transparent substrate; and a pair of spaces respectively defined at opposite sides of the phase shift film pattern portion arranged on the central portion of the transparent substrate, the spaces having the same width as the interval between adjacent pattern portions of the photo shield film pattern, so that the phase shift mask has a function of measuring an alignment error between the photo shield film pattern and phase shift film pattern.

2. The phase shift mask in accordance with claim 1, wherein the photo shield film pattern has the same line width as the interval between adjacent pattern portions thereof.

3. The phase shift mask in accordance with claim 1, wherein the phase shift film pattern is made of a spin on glass layer.

4. The phase shift mask in accordance with claim 1, wherein the phase shift film pattern is made of polymethylmethacrylate.

5. The phase shift mask in accordance with claim 1, wherein the phase shift film pattern is comprised of an oxide film.

6. The phase shift mask in accordance with claim 1, wherein the photo shield film pattern is made of chromium.

7. The phase shift mask in accordance with claim 1, wherein the pattern portion of the phase shift film pattern arranged on the central portion of the transparent substrate has the same line width as the photo shield film pattern.

8. A method for fabricating a phase shift mask, comprising the steps of:

preparing a transparent substrate;

forming a photo shield film pattern on the transparent substrate in such a manner that the photo shield film pattern has a plurality of uniformly spaced pattern portions while having no pattern portion at the central portion of the transparent substrate; and forming a phase shift film pattern on the transparent substrate in such a manner that the phase shift film pattern has a plurality of uniformly spaced pattern portions arranged in an alternating fashion with respect to the pattern portions of the photo shield film pattern and that the phase shift film pattern has a central pattern portion arranged an the central portion of the transparent substrate to define a pair of spaces which are defined respectively at opposite sides of the central pattern portion while having the same width as the interval between adjacent pattern portions of the photo shield film pattern, so that the phase shift mask has a function of measuring an alignment error between the photo shield film pattern and phase shift film pattern.

9. The method for fabricating a phase shift mask in accordance with claim 8, wherein the photo shield film pattern has the same line width as the interval between adjacent pattern portions thereof.

10. The method for fabricating a phase shift mask in accordance with claim 8, wherein the phase shift film pattern is made of a spin on glass layer.

11. The method for fabricating a phase shift mask in accordance with claim 8, wherein the phase shift film pattern is made of polymethylmethacrylate.

12. The method for fabricating a phase shift mask in accordance with claim 8, wherein the phase shift film pattern is comprised of an oxide film.

13. The method for fabricating a phase shift mask in accordance with claim 8, wherein the photo shield film pattern is made of chromium.

14. The method for fabricating a phase shift mask in accordance with claim 8, wherein the pattern portion of the phase shift film pattern arranged on the central portion of the transparent substrate has the same line width as the photo shield film pattern.

* * * * *